(12) United States Patent
Wu et al.

(10) Patent No.: US 7,088,750 B2
(45) Date of Patent: Aug. 8, 2006

(54) ADJUSTABLE LASER MODULE

(75) Inventors: Sheng-Ching Wu, Keelung (TW); Ching-Hui Lin, KaoHsiung (TW); ChaoChi Huang, Taipei (TW)

(73) Assignee: Quartan Inc., Taiwan (TW)

( * ) Notice: Subject to any disclaimer, the term of this patent is extended or adjusted under 35 U.S.C. 154(b) by 272 days.

(21) Appl. No.: 10/728,576

(22) Filed: Dec. 5, 2003

(65) Prior Publication Data

US 2005/0123010 A1 Jun. 9, 2005

(51) Int. Cl.
*H01S 3/13* (2006.01)
(52) U.S. Cl. .................. 372/29.022; 372/20; 372/107; 372/101
(58) Field of Classification Search ................ 372/107, 372/29.02, 20, 101, 29.022
See application file for complete search history.

(56) References Cited

U.S. PATENT DOCUMENTS

| | | | |
|---|---|---|---|
| 4,905,690 A * | 3/1990 | Ohshiro et al. ................ 607/89 |
| 5,111,476 A * | 5/1992 | Hollenbeck et al. ........ 372/107 |
| 5,283,694 A * | 2/1994 | Frady .......................... 359/719 |
| 5,381,438 A * | 1/1995 | Guo et al. ................... 372/107 |
| 5,844,257 A | 12/1998 | Chen |
| 5,900,963 A * | 5/1999 | Li et al. ...................... 359/205 |
| 5,905,751 A * | 5/1999 | Huang et al. ................ 372/101 |
| 5,940,564 A * | 8/1999 | Jewell .......................... 385/93 |
| 6,343,092 B1 * | 1/2002 | Naoe et al. .................. 372/108 |
| 6,485,217 B1 * | 11/2002 | Chien et al. ................. 403/122 |
| 6,513,251 B1 * | 2/2003 | Huang et al. .................. 33/286 |
| 6,621,512 B1 * | 9/2003 | Nakajima et al. ........... 347/245 |
| 6,646,732 B1 * | 11/2003 | Ohtomo et al. .......... 356/141.5 |
| 6,813,303 B1 * | 11/2004 | Matsuda et al. .............. 372/75 |
| 6,931,739 B1 * | 8/2005 | Chang et al. .................. 33/286 |
| 2003/0095840 A1 * | 5/2003 | Wang et al. ................... 408/16 |
| 2004/0177523 A1 * | 9/2004 | Chang et al. .................. 33/281 |
| 2004/0182842 A1 * | 9/2004 | Denney et al. ......... 219/121.84 |
| 2004/0240205 A1 * | 12/2004 | Hayakawa et al. ......... 362/257 |
| 2005/0068542 A1 * | 3/2005 | Howey et al. .............. 356/519 |

FOREIGN PATENT DOCUMENTS

TW 527031 4/2003

* cited by examiner

*Primary Examiner*—Min Sun Harvey
*Assistant Examiner*—Delma R. Flores Ruiz
(74) *Attorney, Agent, or Firm*—Raymond Sun (57) ABSTRACT

An adjustable laser module has a main body, a laser generator provided in the hollow interior of the main body at a first end thereof for emitting a laser beam, a cylindrical lens provided in the hollow interior at a second end thereof, a first adjusting device coupled to the first end and the laser generator for adjusting the angle of the laser generator with respect to the main body, and a second adjusting device coupled to the second end and the cylindrical lens for adjusting the angle of the cylindrical lens with respect to the main body.

15 Claims, 7 Drawing Sheets

ADJUSTABLE LASER MODULE

BACKGROUND OF THE INVENTION

1. Field of the Invention

The present invention relates to a laser module device, and in particular, to a laser module device which can adjust the inclination angles of a laser generator that emits a laser beam, and of a cylindrical lens that receives the laser beam.

2. Description of the Prior Art

The laser is a remarkable invention in modern science. The theory of generating laser light is as follows. According to Bohr's atomic theory, the electrons distributed around atoms or molecules all have a certain energy. The energy of an electron is the sum of its kinetic energy and potential energy, and can only be located at a specific energy level among a series of discontinuous separate energy levels. The state with the lowest energy is called the ground state (low-energy state). Although most electrons are usually in the ground state with the lowest energy in a state of thermal equilibrium, when energy in any form (heat, light, electricity, chemical effect, etc.) is added from outside to the electrons in the ground state, the electrons will be excited and move to a higher-energy state (excited state). The excited state is not stable and has a tendency to return to the low-energy state. At that time, the electrons at the higher energy level will fall back to the ground state due to stimulated emission, and release the excess energy at the same time. The excess energy will be converted to hv (h: Planck constant, v: light frequency), that is, the so-called light quantum or photon. If the electrons stay in the excited state longer than the time that they stay in the ground state, or if many particles at the low energy level can be moved to a higher-energy level in a very short period of time, and if the electrons in the excited state generate stimulated emission (high energy level/low energy level) that is accompanied with the release of photons at the same time, it is possible to generate a large quantity of light with the same orientation, the same frequency, and the same phase if the light is amplified repeatedly by a back-coupling mechanism. This is the basic theory of generating a laser beam.

A laser module includes a laser unit used for generating a laser beam, and a corresponding control circuit. With the aid of a lens, this device can generate a highly-collimated laser beam. The laser module has therefore been used widely in various application fields. For example, the popular laser pointer is formed by adding a laser module at the front end of a pen body. The laser beam generated by the laser module can form a very bright light spot on an object for instructional purposes. In addition, a laser module can also be used for a collimator, level meter, laser projector, etc.

Figure 1A:
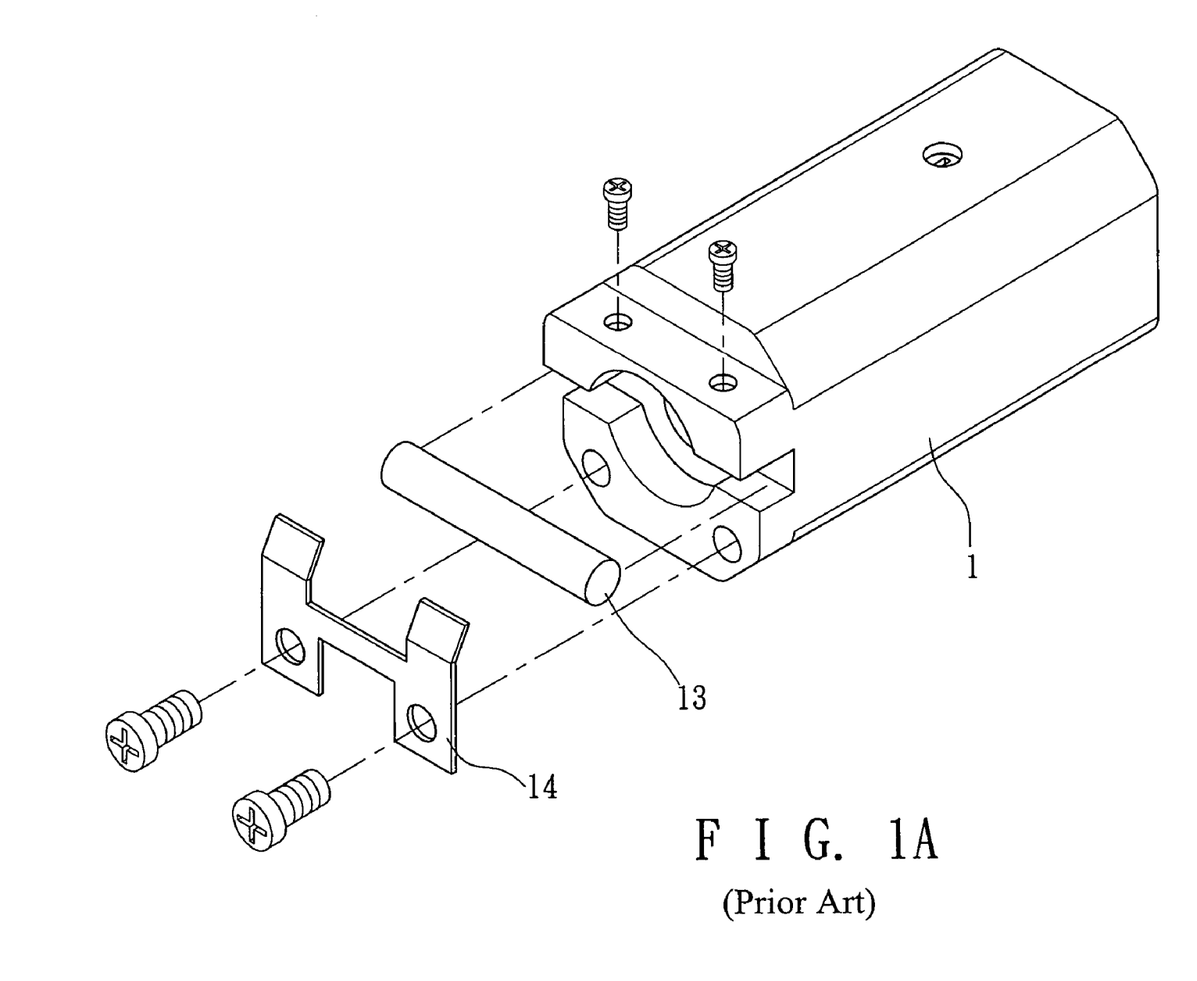
FIG. 1A is an exploded perspective view of a conventional laser module.
Figure 1B:
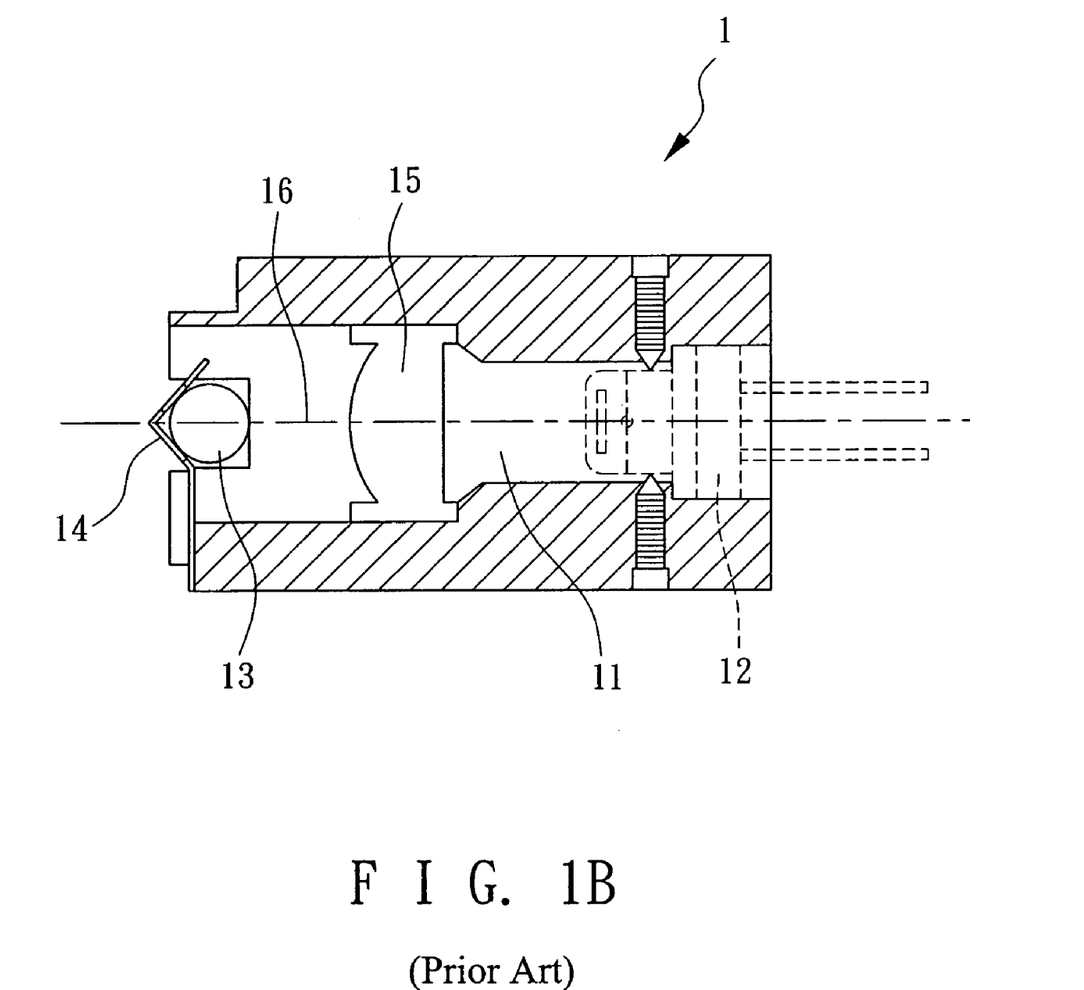
FIG. 1B is a cross-sectional view of the conventional laser module of FIG. 1A.

FIGS. 1A and 1B illustrate the structure of a conventional laser module. A conventional laser module 1 has a hollow cylindrical structure as a housing space 11. A laser generator 12 and a cylindrical lens 13 are respectively connected to the opposite ends of the housing space 11. A convex lens 15 is positioned in the middle of the housing space 11 between the laser generator 12 and the lens 13. After the device is turned on, laser generator 12 will emit a laser beam. The laser beam becomes parallel after passing through the housing space 11 and the convex lens 15. The light beam then reaches cylindrical lens 13 where it is refracted. A light shield 14 can be used to eliminate parasitic light to provide a linear laser beam for use. However, deviation usually occurs in the mounting angle of the laser generator 12 when it is connected inside the housing space 11. As a result, the laser beam does not travel along the central axis 16 of the housing spacing 11, resulting in deviation in the angle of incidence on the cylindrical lens 13. Alternatively, if there is deviation in the mounting angle of the cylindrical lens 13 when it is mounted inside housing space 11, the laser beam will lose most of its energy after it is refracted by the cylindrical lens 13. As a result, a relatively short or weak linear laser beam, or a laser beam with relatively large curvature, will be generated. Such laser beams will not meet the user's requirements.

Consequently, there is a need for improved laser modules which overcome the drawbacks described above.

SUMMARY OF THE INVENTION

It is an object of the present invention to provide an adjustable laser module which emits a more accurate and aligned laser beam.

It is another object of the present invention to provide an adjustable laser module which provides at least one adjusting device for adjusting the angle of inclination and the relative position of a laser generator or a cylindrical lens.

It is yet another object of the present invention to provide an adjustable laser module which reduces the complexity of positioning during assembly.

In order to achieve the objectives of the present invention, there is provided an adjustable laser module having a main body, a laser generator provided in the hollow interior of the main body at a first end thereof for emitting a laser beam, a cylindrical lens provided in the hollow interior at a second end thereof, a first adjusting device coupled to the first end and the laser generator for adjusting the angle of the laser generator with respect to the main body, and a second adjusting device coupled to the second end and the cylindrical lens for adjusting the angle of the cylindrical lens with respect to the main body.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims.

Figure 2A:
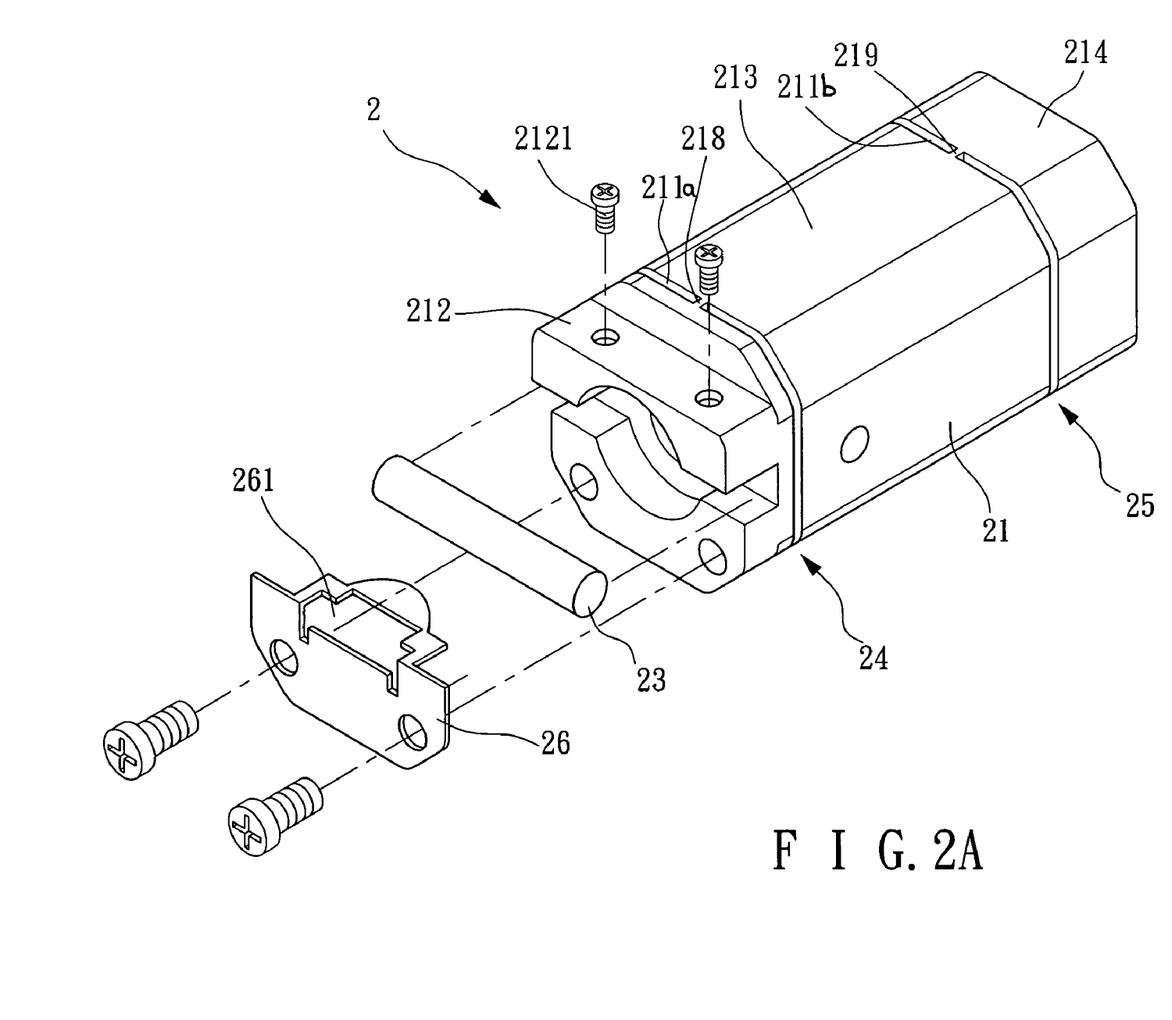
FIG. 2A is a perspective view of a laser module according to one embodiment of the present invention.
Figure 2B:
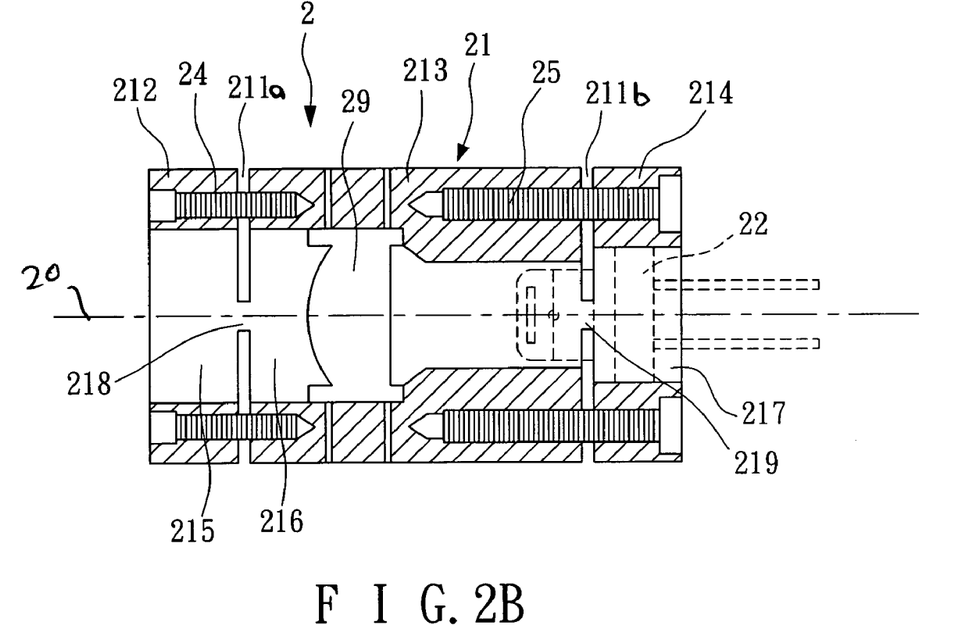
FIG. 2B is a horizontal cross-sectional view of the laser module of FIG. 2A.
Figure 2C:
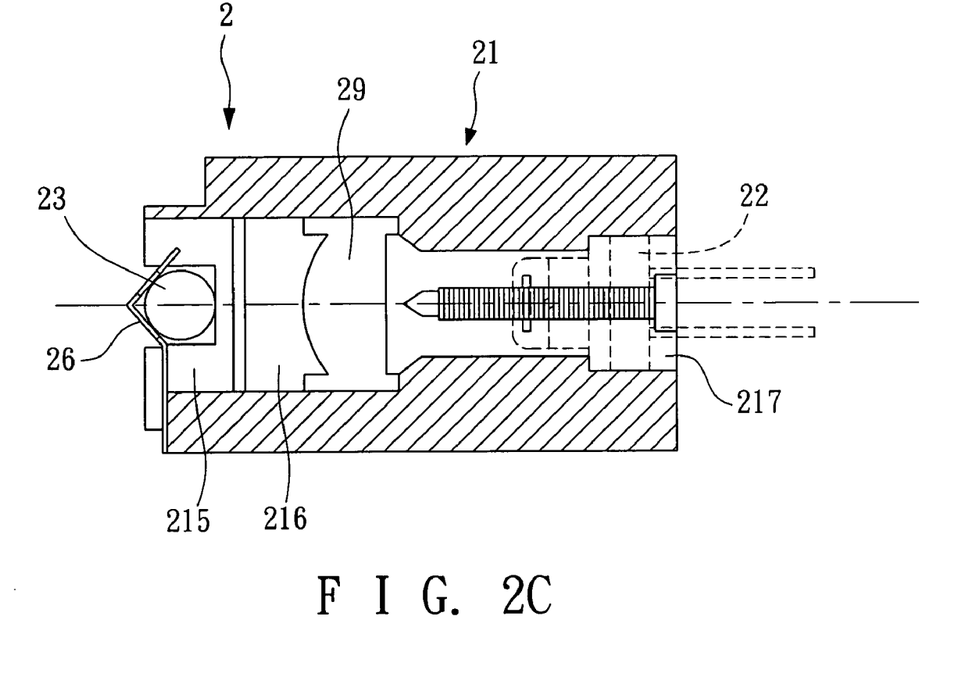
FIG. 2C is a vertical cross-sectional view of the laser module of FIG. 2A.

FIGS. 2A–2C illustrate one embodiment of a laser module according to the present invention. Adjustable laser module 2 includes a main body 21, a laser generator 22, a cylindrical lens 23, a first adjusting device 24, and a second adjusting device 25. The main body 21 has a hollow cylindrical structure. Two sets of slots, a pair of front slots 211a and a pair of rear slots 211b, are provided. The pair of slots 211a are aligned with each other and communicate with the hollow interior of the main body 21. Similarly, the pair of slots 211b are aligned with each other and communicate with the hollow interior of the main body 21. The two pairs of slots 211a, 211b are formed at locations of the main body 21 that are spaced apart from the opposing ends of the main body 21. The slots 211a, 211b sequentially divide the main body 21 into a front seat 212, main seat body 213, and a back seat 214, and correspondingly divide the interior of the main body 21 into a first housing portion 215, a second housing portion 216, and a third housing portion 217. Based on this arrangement, the main body 21 can have a first joining part 218 that connects the front seat 212 with the main seat body 213, and a second joining part 219 that connects the back seat 214 to the main seat body 213.

The laser generator 22 can be connected to the third housing portion 217. The second adjusting device 25 can be provided in the form of two bolts. The bolts of the second adjusting device 25 can be connected and engaged with the main seat body 213 by threading through the back seat 214 and the rear slots 211b, on both sides of the second joining part 219, in a manner such that the bolts are parallel to the longitudinal axis 20. The two bolts are tightened to press the back seat 214 to tilt to either side, with the second joining part 219 serving as a pivot to change the angle of the back seat 214 with respect to the longitudinal axis 20 of the main body 21. Therefore, the second adjusting device 25 is used to adjust and change the inclination angle of the back seat 214 that is connected to the main seat body 213, with the slots 211b providing the space needed for the back seat 214 to tilt.

The cylindrical lens 23 can be secured inside a channel at the front seat 212 by bolts 2121. An elastic light shield 26 can be fixed in front of the lens 23 at the front seat 212 according to techniques known in the art. The first adjusting device 24 can also be provided in the form of two bolts. The bolts of the first adjusting device 24 can be connected and engaged with the main seat body 213 by threading through the front seat 212 and the front slots 211a, on both sides of the first joining part 218, in a manner such that the bolts are parallel to the longitudinal axis 20. The two bolts of the first adjusting device 24 are tightened to press the front seat 212 to tilt to either side, with the first joining part 218 serving as a pivot to change the angle of the front seat 212 with respect to the longitudinal axis 20 of the main body 21. Therefore, the first adjusting device 24 can be used to adjust and change the inclination angle of the front seat 212 that is connected to the main seat body 213, with the slots 211a providing the space needed for the front seat 212 to tilt.

Figure 3:
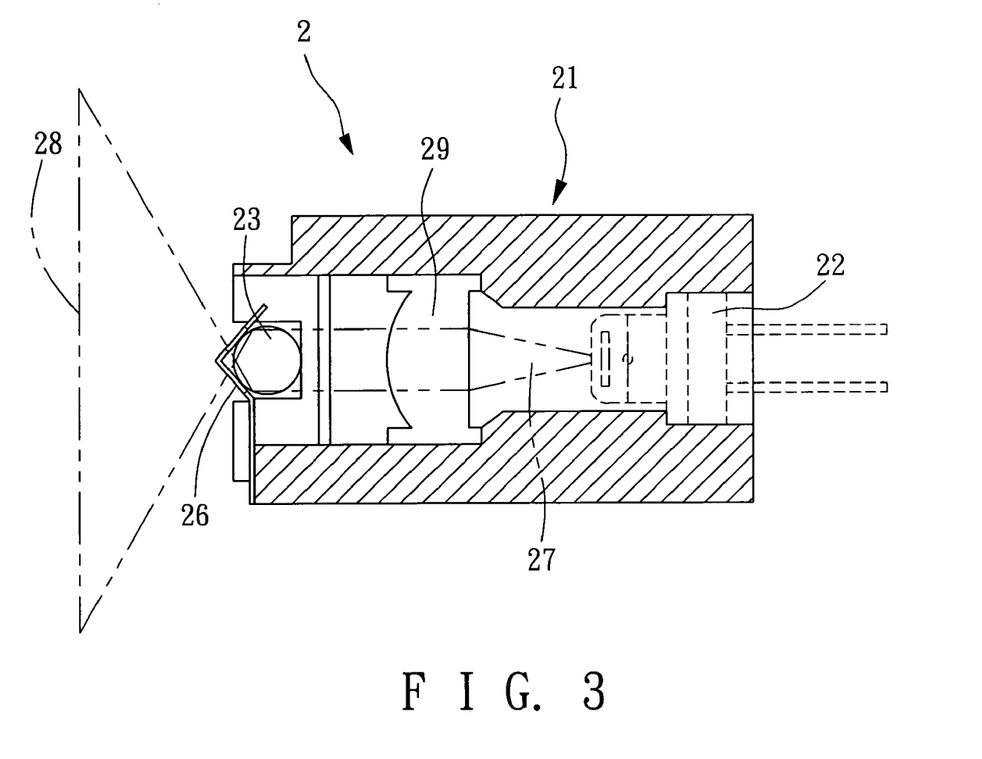
FIG. 3 illustrates the desired path of the laser beam in the laser module of FIG. 2A.

FIG. 3 illustrates the desired path of the laser beam in the adjustable laser module 2. When the laser generator 22 is connected to the third housing portion 217, the light beam generated by the laser generator 22 can be converted to a collimated laser beam 27 by passing through convex lens 29 that is positioned between the laser generator 22 and the lens 23. However, if the laser generator 22 is tilted, part of the laser beam 27 will be projected on to the interior sidewall of the second housing portion 216, so that the cylindrical lens 23 will not completely receive the laser beam 27. As a result, a relatively short or weak linear laser beam, or a laser beam with relatively large curvature, will be formed. Therefore, it is necessary to use the second adjusting device 25 to adjust the inclination angle of the back seat 214 with respect to the main seat body 213 so that the laser beam 27 can be aligned with the horizontal axis 20 and accurately reach the cylindrical lens 23 via the second housing portion 216 and the first housing portion 215.

Similarly, when the cylindrical lens 23 receives the laser beam 27, if the mounting angle of cylindrical lens 23 is deviated, a curved laser beam will be generated after the laser beam 27 enters the cylindrical lens 23 and is refracted. Therefore, it is necessary to use the first adjusting device 24 to adjust and change the inclination angle of the front seat 212 with respect to the main seat body 213 to correct the mounting angle of the cylindrical lens 23.

In the embodiment of FIGS. 2A–2C, the light shield 26 can be screwed to the front seat 212 and arranged on the outer periphery of the cylindrical lens 23. The light shield 26 has a hole 261. Therefore, after the laser beam 27 reaches the cylindrical lens 23, the light shield 26 is used to filter the parasitic light that is not refracted by the cylindrical lens 23, so that a usable linear laser beam 28 is then emitted via the hole 261.

Figure 4A:
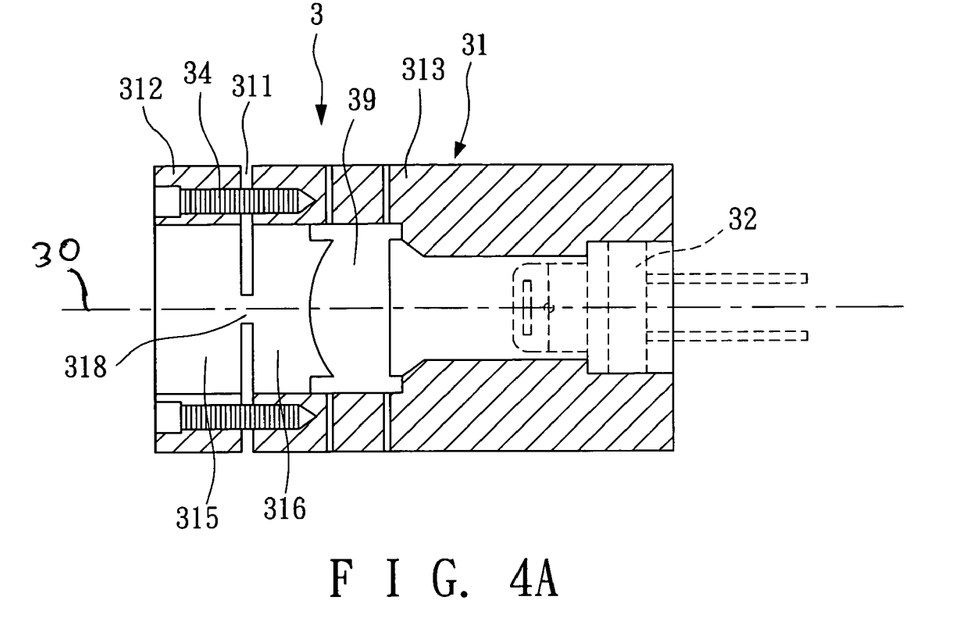
FIG. 4A is a horizontal cross-sectional of a laser module according to another embodiment of the present invention.
Figure 4B:
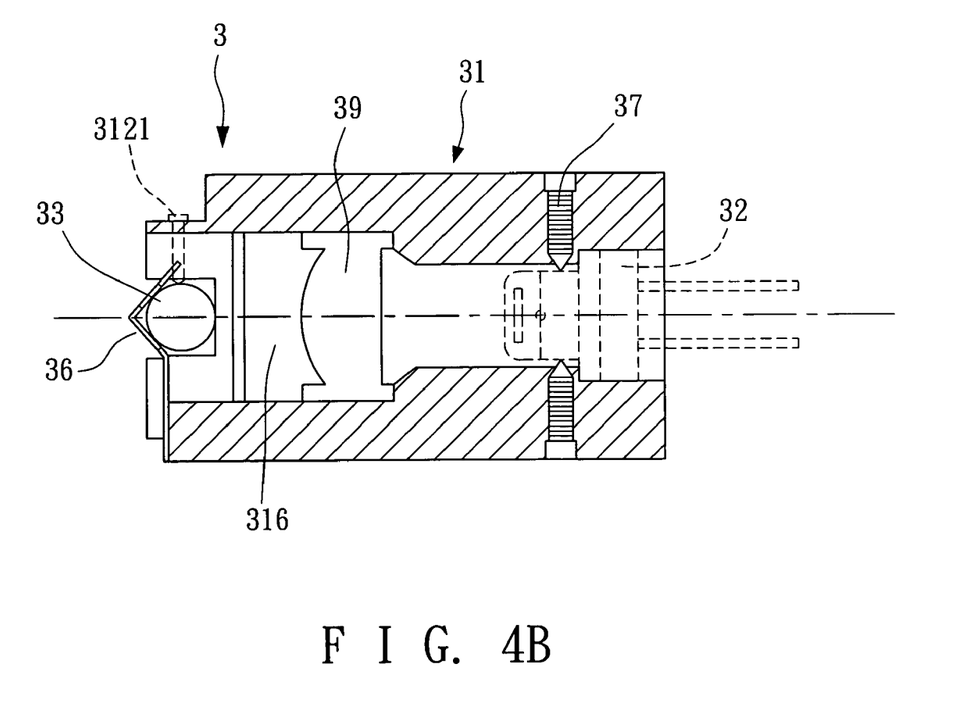
FIG. 4B is a vertical cross-sectional view of the laser module of FIG. 4A.

FIGS. 4A and 4B illustrate another adjustable laser module 3 according to the present invention, which includes a main body 31, a laser generator 32, a cylindrical lens 33, and an adjusting device 34. The main body 31 has a hollow cylindrical structure. A pair of aligned slots 311 communicate with the hollow interior of the main body 31, and are formed at locations of the main body 31 that are spaced apart from one end of the main body 31. The slots 311 divide the main body 31 into a front seat 312 and a main seat body 313. The front seat 312 defines a first housing portion 315, while the main seat body 313 defines a second housing portion 316. Based on this configuration, the main body 31 can have a joining part 318 that connects the front seat 312 with the main seat body 313.

The laser generator 32 can be secured in the second housing portion 316. A laser beam is emitted from laser generator 32. The main body 31 also has an adjusting device 37 that, in this embodiment, comprises four bolts that extend radially inwardly through the main body 31 to grip the laser generator 32. These four bolts are positioned in spaced apart manner around the four sides surrounding the laser generator 32. See FIG. 4B, which only shows two of the bolts. The inclination angle of laser generator 32 with respect to the second housing portion 316 can be adjusted by adjusting the relative positions of the four bolts of the adjusting device 37 (e.g., by threading the bolts to different degrees).

The cylindrical lens 33 can be secured inside a channel at the front seat 312 by bolts 3121. An elastic light shield 36 can be fixed in front of the lens 33 at the front seat 312 according to techniques known in the art. The adjusting device 34 can be provided in the form of two bolts. The bolts of the adjusting device 34 can be connected and engaged with the main seat body 313 by threading through the front seat 312 and the front slots 311, on both sides of the first joining part 318, in a manner such that the bolts are parallel to the longitudinal axis 30. The two bolts of the adjusting device 34 are tightened to press the front seat 312 to tilt to either side, with the first joining part 318 serving as a pivot to change the angle of the front seat 312 with respect to the longitudinal axis 30 of the main body 31. Therefore, the adjusting device 34 can be used to adjust and change the inclination angle of the front seat 312 that is connected to main seat body 313, with the slots 311 providing the space needed for the front seat 312 to tilt. In addition, a convex lens 39 can be positioned between the laser generator 32 and the lens 33.

Thus, the laser modules 2 and 3 are essentially the same, except that the laser generators 22 and 32 are adjusted by different adjusting devices 25 and 37, respectively.

Figure 5A:
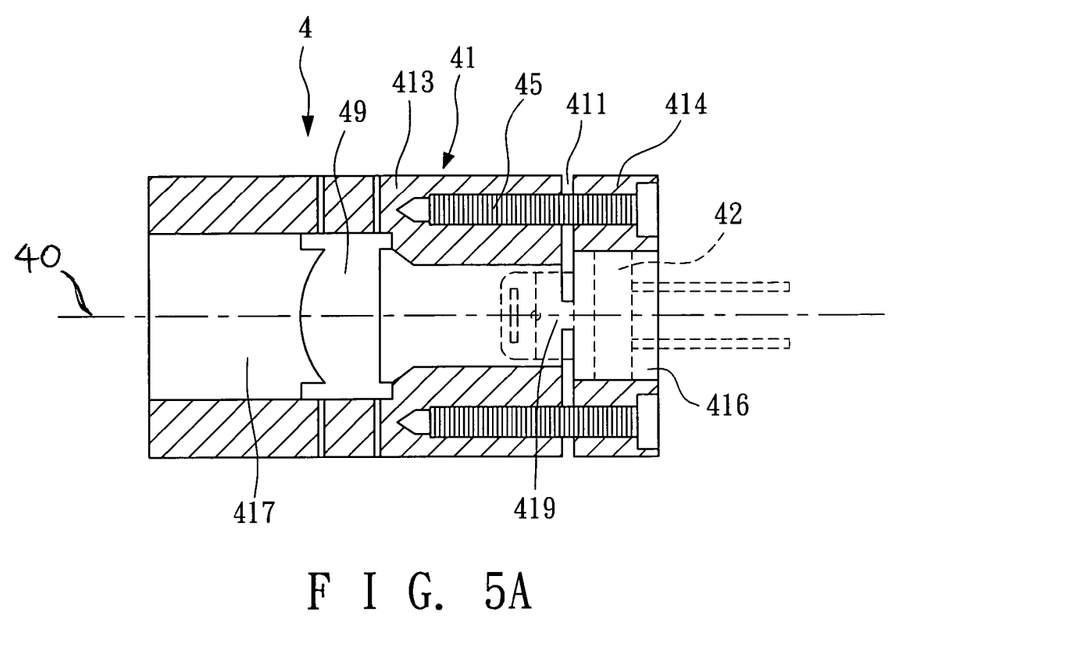
FIG. 5A is a horizontal cross-sectional of a laser module according to yet another embodiment of the present invention.
Figure 5B:
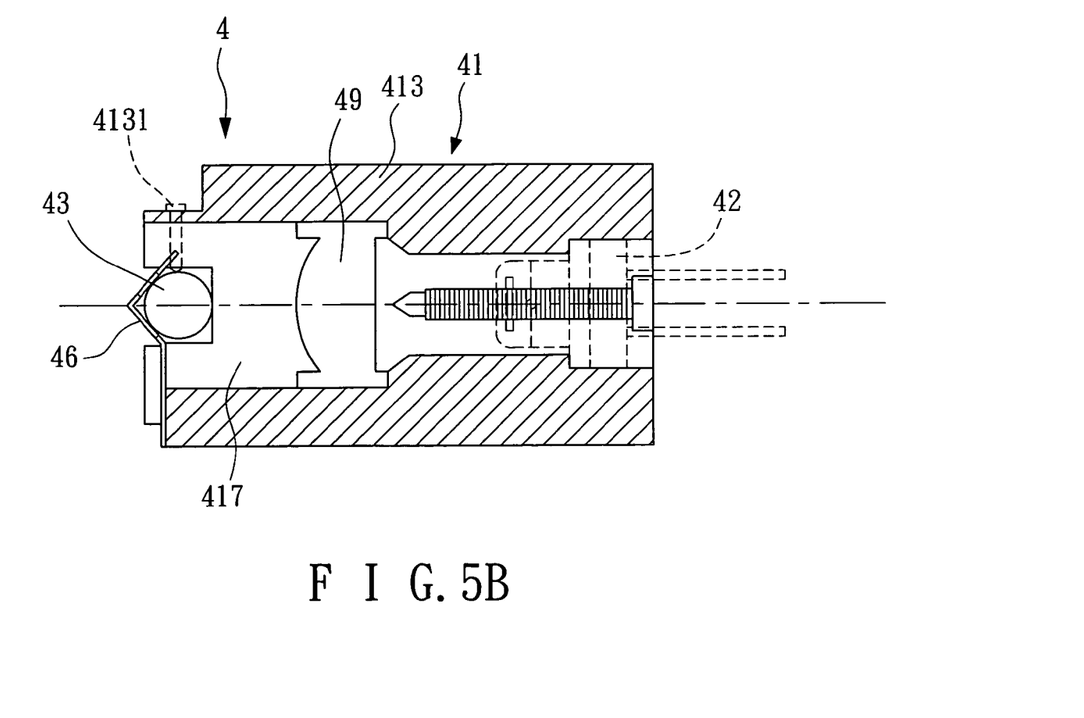
FIG. 5B is a vertical cross-sectional view of the laser module of FIG. 5A.

FIGS. 5A and 5B illustrate another adjustable laser module 4 according to the present invention, which includes a main body 41, a laser generator 42, a cylindrical lens 43, and an adjusting device 45. The main body 41 has a hollow cylindrical structure. A pair of aligned slots 411 communicate with the hollow interior of the main body 41, and are formed at locations of the main body 41 that are spaced apart from one end of the main body 41. The slots 411 divide the main body 41 into a back seat 414 and a main seat body 413. The back seat 414 defines a first housing portion 416, while the main seat body 413 defines a second housing portion 417. Based on this configuration, the main body 41 can have a joining part 419 that connects the back seat 414 with the main seat body 413.

The laser generator 42 can be connected to the first housing portion 416. The adjusting device 45 can be provided in the form of two bolts. The bolts of the adjusting device 45 can be connected and engaged with the main seat body 413 by threading through the back seat 414 and the slots 411, on both sides of the joining part 419, in a manner such that the bolts are parallel to the longitudinal axis 40. The two bolts are tightened to press the back seat 414 to tilt to either side, with the joining part 419 serving as a pivot to change the angle of the back seat 414 with respect to the longitudinal axis 40 of the main body 41. Therefore, the adjusting device 45 is used to adjust and change the inclination angle of back seat 414 that is connected to the main seat body 413, with the slots 411 providing the space needed for the back seat 414 to tilt.

The cylindrical lens 43 can be secured inside a channel at the main seat body 413 by bolts 4131. An elastic light shield 46 can be fixed in front of the lens 43 at the main seat body 413 according to techniques known in the art. The lens 43 can be provided without any adjusting device. Thus, the adjusting device 45 alone is used to adjust the laser beam projected onto the cylindrical lens 43.

Thus, the laser modules 2 and 4 are essentially the same, except that the cylindrical lens 43 is not adjusted.

The aforementioned adjustable laser module of the present invention provides at least one adjusting device to adjust the inclination angle and relative position of the laser generator or the cylindrical lens to reduce the complexity of positioning during assembly, and to emit a more accurate and defined linear light beam.

While the description above refers to particular embodiments of the present invention, it will be understood that many modifications may be made without departing from the spirit thereof. The accompanying claims are intended to cover such modifications as would fall within the true scope and spirit of the present invention.

What is claimed is:

1. An adjustable laser module, comprising:
   a main body having a hollow interior, a first end and a second end;
   a laser generator provided in the hollow interior at the first end for emitting a laser beam;
   a cylindrical lens provided in the hollow interior at the second end;
   a first adjusting device coupled to the first end and the laser generator for adjusting the angle of the laser generator with respect to the main body; and
   a second adjusting device coupled to the second end and the cylindrical lens for adjusting the angle of the cylindrical lens with respect to the main body.

2. The module of claim 1, further including a convex lens positioned in the hollow interior between the cylindrical lens and the laser generator.

3. The module of claim 1, wherein the first adjusting device comprises a slot formed in the main body adjacent to but spaced apart from the first end, and a bolt extending through a part of the first end of the main body and the slot at an orientation perpendicular to the slot.

4. The module of claim 3, wherein the slot is a first slot, and the bolt is a first bolt, wherein the second adjusting device comprises a second slot formed in the main body adjacent to but spaced apart from the second end, and a second bolt extending through a part of the second end of the main body and the second slot at an orientation perpendicular to the second slot.

5. The module of claim 1, wherein the first adjusting device comprises a plurality of bolts extending radially inwardly through the main body to contact the laser generator.

6. The module of claim 3, wherein the slot defines a space, with the first end tilted into the space of the slot when the at least one bolt is adjusted.

7. The module of claim 1, when the angle of the first end is adjusted with respect to the remainder of the main body.

8. An adjustable laser module, comprising:
   a main body having a hollow interior, a back seat and a main seat body that has a channel;
   a laser generator provided in the hollow interior at the back seat for emitting a laser beam;

a cylindrical lens provided in the channel of the main seat body; and an adjusting device for adjusting the angle of the back seat with respect to the main seat body.

9. The module of claim 8, further including a convex lens positioned in the hollow interior between the cylindrical lens and the laser generator.

10. The module of claim 8, wherein the adjusting device comprises a slot to divide the main body into the back seat and the main seat body, and at least one bolt extending through the back seat and the slot at an orientation perpendicular to the slot.

11. The module of claim 10, wherein the slot defines a space, with the back seat tilted into the space of the slot when the at least one bolt is adjusted.

12. An adjustable laser module, comprising:

a main body having a hollow interior, a main seat body and a front seat that has a channel;

a laser generator provided in the hollow interior at the main seat body for emitting a laser beam;

a cylindrical lens provided in the channel of the front seat; and an adjusting device for adjusting the angle of the front seat with respect to the main seat body.

13. The module of claim 12, further including a convex lens positioned in the hollow interior between the cylindrical lens and the laser generator.

14. The module of claim 12, wherein the adjusting device comprises a slot to divide the main body into the front seat and the main seat body, and at least one bolt extending through the front seat and the slot at an orientation perpendicular to the slot.

15. The module of claim 14, wherein the slot defines a space, with the front seat tilted into the space of the slot when the at least one bolt is adjusted.

* * * * *